(12) United States Patent
Chaffins et al.

(10) Patent No.: US 10,375,765 B2
(45) Date of Patent: Aug. 6, 2019

(54) 3-DIMENSIONAL PRINTED LOAD CELL PARTS

(71) Applicant: Hewlett-Packard Development Company, L.P., Houston, TX (US)

(72) Inventors: Sterling Chaffins, Corvallis, OR (US); Cassady Roop, Corvallis, OR (US); Kevin P. DeKam, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/073,142

(22) PCT Filed: Apr. 15, 2016

(86) PCT No.: PCT/US2016/027970
§ 371 (c)(1),
(2) Date: Jul. 26, 2018

(87) PCT Pub. No.: WO2017/180163
PCT Pub. Date: Oct. 19, 2017

(65) Prior Publication Data
US 2019/0022929 A1    Jan. 24, 2019

(51) Int. Cl.
*H05B 3/14* (2006.01)
*G01L 1/22* (2006.01)
(Continued)

(52) U.S. Cl.
CPC ........... *H05B 3/146* (2013.01); *B29C 64/165* (2017.08); *B29C 64/209* (2017.08); *B29C 64/218* (2017.08); *G01B 1/00* (2013.01); *G01B 7/18* (2013.01); *G01L 1/2293* (2013.01); *H05B 3/145* (2013.01); *B29K 2101/12* (2013.01); *B33Y 10/00* (2014.12); *B33Y 30/00* (2014.12);
(Continued)

(58) Field of Classification Search
CPC ... G01L 1/2281; G01L 1/2287; G01L 1/2206; H01C 17/06526; H01C 17/24; H01C 13/02
See application file for complete search history.

(56) References Cited

U.S. PATENT DOCUMENTS 2,953,764 A * 9/1960 Tellkamp ............... H01C 1/032
338/309
4,146,867 A * 3/1979 Blangeard ............... H01C 7/22
338/195

(Continued)

FOREIGN PATENT DOCUMENTS

EP    2001656    10/2014
EP    2963995    1/2016
(Continued)

*Primary Examiner* — Kyung S Lee
(74) *Attorney, Agent, or Firm* — Thorpe North & Western LLP

(57) ABSTRACT

A 3-dimensional printed load cell part can include a part body formed of fused thermoplastic polymer particles, and a plurality of strain sensors separately formed of a matrix of conductive particles interlocked with a matrix of fused thermoplastic polymer particles. The plurality of strain sensors can have a first electrical contact at a first end and a second electrical contact at a second end. The particles of the plurality of strain sensors can be continuously fused to the particles of the part body.

20 Claims, 6 Drawing Sheets

(51) Int. Cl.
*G01B 1/00* (2006.01)
*G01B 7/16* (2006.01)
*B29C 64/165* (2017.01)
*B29C 64/218* (2017.01)
*B29C 64/209* (2017.01)
*B33Y 10/00* (2015.01)
*B33Y 30/00* (2015.01)
*B33Y 80/00* (2015.01)
*B29K 101/12* (2006.01)
*C09D 11/037* (2014.01)

(52) U.S. Cl.
CPC ............ *B33Y 80/00* (2014.12); *C09D 11/037* (2013.01); *H05B 2203/003* (2013.01); *H05B 2203/013* (2013.01); *H05B 2203/017* (2013.01)

(56) References Cited

U.S. PATENT DOCUMENTS

| | | | | |
|---|---|---|---|---|
| 4,146,957 A | * | 4/1979 | Toenshoff | G01K 7/183 29/612 |
| 4,342,217 A | * | 8/1982 | Paetow | G01L 1/2287 338/2 |
| 4,432,247 A | * | 2/1984 | Takeno | G01L 1/2206 338/2 |
| 4,777,826 A | * | 10/1988 | Rud, Jr. | G01L 1/2281 338/195 |
| 4,859,981 A | * | 8/1989 | Peschl | H01C 7/22 338/308 |
| 6,363,606 B1 | | 4/2002 | Johnson et al. | |
| 7,553,512 B2 | | 6/2009 | Kodas et al. | |
| 7,987,589 B2 | | 8/2011 | Huang et al. | |
| 8,481,902 B2 | | 7/2013 | Leboeuf et al. | |
| 9,228,859 B2 | | 1/2016 | Ranky et al. | |
| 2007/0238056 A1 | | 10/2007 | Baumann et al. | |
| 2007/0241482 A1 | | 10/2007 | Giller et al. | |
| 2012/0247220 A1 | * | 10/2012 | Inamori | G01B 7/18 73/766 |
| 2013/0079693 A1 | | 3/2013 | Ranky et al. | |
| 2013/0320467 A1 | | 12/2013 | Buchanan et al. | |
| 2014/0238153 A1 | | 8/2014 | Wood et al. | |
| 2014/0268607 A1 | | 9/2014 | Wicker et al. | |
| 2015/0109006 A1 | | 4/2015 | Choi et al. | |

FOREIGN PATENT DOCUMENTS

| | | | |
|---|---|---|---|
| JP | 63226901 | | 9/1988 |
| JP | H06176857 | | 6/1994 |
| JP | 2001153735 | | 6/2001 |
| JP | 2013092427 A | * | 5/2013 |
| JP | 2013096821 A | * | 5/2013 |
| WO | WO-2014209994 A2 | | 12/2014 |
| WO | WO-2015082179 A1 | | 6/2015 |
| WO | WO-2015165884 | | 11/2015 |
| WO | WO-2015178980 | | 11/2015 |
| WO | WO-2015193045 | | 12/2015 |

* cited by examiner

3-DIMENSIONAL PRINTED LOAD CELL PARTS

BACKGROUND

A load cell is a transducer that can convert a mechanical input to an electrical output. Some load cells include one or more strain sensors, which are typically made of a metal foil pattern or similar material. These strain sensors can be placed in such a way that the strain being measured will cause the metal foil pattern to flex. Depending on the direction of flexing, the metal foil pattern can be subjected to compressive or tensile forces. When the metal foil pattern is compressed, the length of the metal foil pattern is slightly reduced and the thickness is slightly increased, which results in an overall reduction in electrical resistance. When the metal foil pattern is under tensile stress, the length of the metal foil pattern increases slightly and the thickness is slightly reduced, resulting in an increase in electrical resistance. These small changes in electrical resistance can be detected and correlated to the strain experienced by the strain sensor.

The strain sensors of a load cell can be adhered to a variety of substrates, such as polyimide film, polyester film, ceramic, glass, silicon, and so on. Both sides of the substrate can be patterned so that flexing of the substrate produces compression on one side and tension on the other side. In some examples, the metal foil patterns on each side can be connected in a Wheatstone bridge to produce an output voltage that indicates both the magnitude and direction of the bending stress that the sensor, and the object to which the sensor is affixed, is experiencing.

Figure 1:
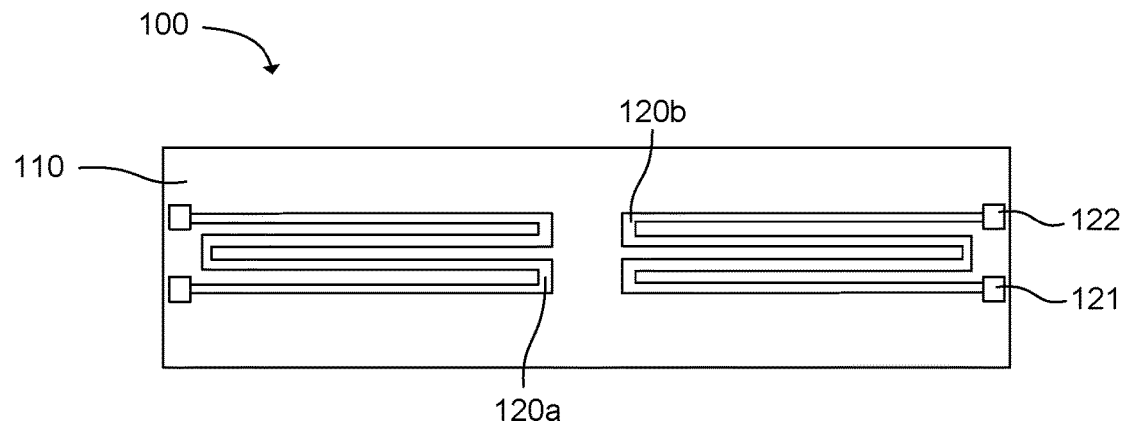
FIG. 1 represents a view of a top surface of a 3-dimensional printed load cell part prepared in accordance with examples of the present disclosure.

The figures depict several examples of the presently disclosed technology. However, it should be understood that the present technology is not limited to the examples depicted.

DETAILED DESCRIPTION

The present disclosure is drawn to load cells and 3D printing. More specifically, the present disclosure provides 3-dimensional printed load cell parts, a method of manufacturing 3-dimensional printed load cell parts with a plurality of integrated strain sensors, and a load cell.

The 3-dimensional load cell parts described herein can have a part body formed of fused thermoplastic polymer particles and a plurality of strain sensors. The plurality of strain sensors can be separately formed of a matrix of conductive particles interlocked with a matrix of fused thermoplastic polymer particles. Each of the plurality of strain sensors can have a first electrical contact at a first end and a second electrical contact at a second end. Further, the particles of each of the plurality of strain sensors can be continuously fused to the particles of the part body.

In some examples, the plurality of strain sensors can be formed on a surface of the printed part. In other examples, the plurality of strain sensors can be embedded in the part body and a plurality of electrical contacts of the plurality of strain sensors can be formed on and/or extend to a surface of the printed part. In some particular examples, each of the plurality of strain sensors can have a resistance from 1 ohm to 1 megaohm. In one specific example, the conductive particles can include elemental transition metal particles selected from the group consisting of silver particles, copper particles, gold particles, and combinations thereof. In some examples, the fused thermoplastic polymer particles can include a fusing agent selected from carbon black, a near-infrared absorbing dye, a near-infrared absorbing pigment, a tungsten bronze, a molybdenum bronze, metal nanoparticles, a conjugated polymer, or combinations thereof. In additional examples, each of the plurality of strain sensors further includes an activating ink in the matrix of conductive particles, the matrix of fused thermoplastic polymer particles, or both. In further examples, the part body is formed of multiple layers of fused thermoplastic polymer particles stacked in a z-axis direction, and wherein each of the plurality of strain sensors is oriented at least partially in the z-axis direction.

A method of making a 3-dimensional printed load cell part having a plurality of integrated strain sensors is also described herein. The method can include dispensing a conductive fusing ink onto a plurality of sensor areas of a layer of thermoplastic polymer particles, wherein the conductive fusing ink includes conductive particles. The method can also include dispensing a second fusing ink onto non-sensor areas of the layer of thermoplastic polymer particles, wherein the second fusing ink includes a fusing agent capable of absorbing electromagnetic radiation to produce heat. Additionally, the method can include fusing the plurality of sensor areas and the non-sensor areas with electromagnetic radiation to form a plurality of strain sensors in the plurality of sensor areas and a part body in the non-sensor areas. The plurality of strain sensors can each include a matrix of conductive particles interlocked with a matrix of fused thermoplastic polymer particles and the part body can include fused thermoplastic polymer particles. The particles of each of the plurality of strain sensors can be continuously fused to the particles of the part body.

In some examples, each of the plurality of strain sensors is formed at least partially oriented in a z-axis direction such that each of the strain sensors extends across multiple layers of the 3-dimensional printed load cell part. In some examples, each of the plurality of strain sensors is formed across the same multiple layers. In other examples, a first set of the plurality of strain sensors is formed across different layers than a second set of the plurality of strain sensors.

A load cell is also described herein. The load cell can include a first set of strain sensors electrically connected along a first current path, said first set of strain sensors being separately formed of a matrix of conductive particles interlocked with a matrix of fused thermoplastic polymer particles. Additionally, the load cell can include a second set of strain sensors electrically connected along a second current path, said second set of strain sensors being separately formed of a matrix of conductive particles interlocked with a matrix of fused thermoplastic polymer particles. The first current path and the second current path can be parallel current paths in a common electrical circuit.

In some examples, the first set of strain sensors and the second set of strain sensors are formed as part of a monolithic body. In some examples, the first set of strain sensors and the second set of strain sensors are interconnected by embedded internal electrical connections formed of a matrix of conductive particles interlocked with a matrix of fused thermoplastic polymer particles.

With this general overview in mind, FIG. 1 illustrates one example of a 3-dimensional (3D) printed load cell part 100. The 3D printed load cell part can include a body 110 and a plurality of strain sensors, such as strain sensors 120a, 120b. The strain sensors can have a first electrical contact 121 at a first end and a second electrical contact 122 at a second end. The strain sensors can be integrally formed with the part body. As illustrated in FIG. 1, the plurality of strain sensors can be integrally formed on a surface of the part body.

Figure 2:
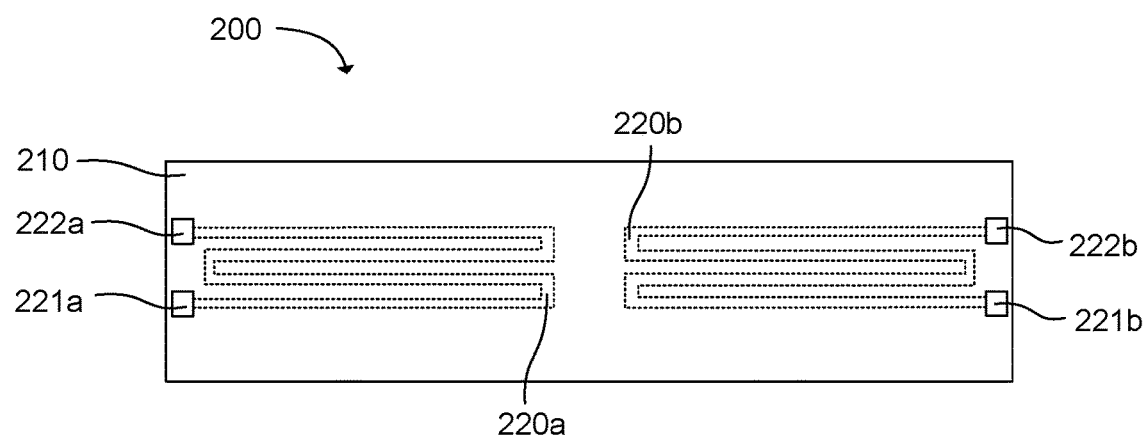
FIG. 2 represents a view of a top surface of another 3-dimensional printed load cell part prepared in accordance with examples of the present disclosure.

However, FIG. 2 illustrates an alternative embodiment of a 3D printed load cell part 200 where a plurality of strain sensors 220a, 220b are embedded within the part body 210. To facilitate electrical contact with the strain sensors, a number of electrical contacts of the strain sensors, such as electrical contacts 221a, 222a, 221b, 222b, can be formed on and/or extend to the surface of the printed part. While FIG. 2 illustrates both electrical contacts of each of the plurality of strain sensors being formed on and/or extending to the surface of the part body, in other embodiments not all of the electrical contacts need extend to the surface. For example, a number of embedded connections can be formed between the plurality of strain sensors. In some cases, where embedded connections are made between the plurality of strain sensors, the number of electrical connections extending to the surface of the part body can be reduced, such as by half. This can reduce the need for external wiring to interconnect the plurality of strain gauges in a load cell.

Figure 3:
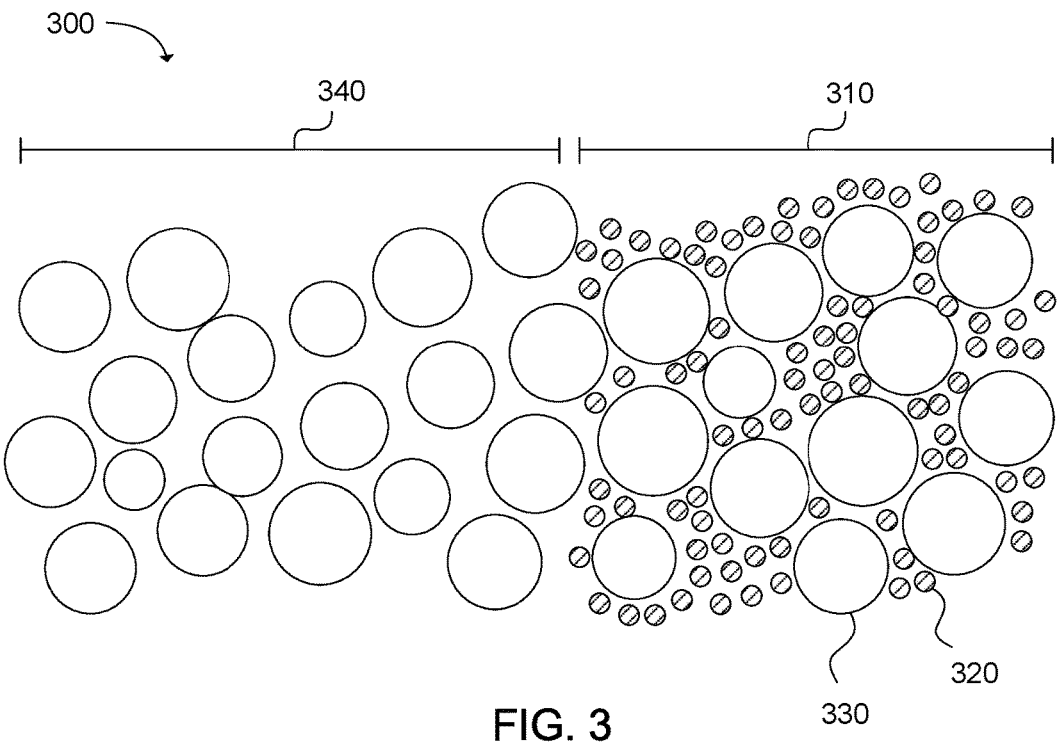
FIG. 3 represents a layer of composite material prior to fusing, which can be used to prepare a 3-dimensional printed load cell part in accordance with examples of the present disclosure.

Each of the plurality of strain sensors can be separately formed of conductive particles interlocked in a matrix of thermoplastic polymer particles. The conductive composite material making up each of the strain sensors is shown in more detail in FIGS. 3-4. As shown in FIG. 3, each of the strain sensors can be formed from thermoplastic polymer particles 330 and conductive particles 320. In one example of a method of making a 3D printed load cell part, a layer 300 of thermoplastic polymer particles can be spread in a powder bed 3-dimensional printer. Individual sensor areas, such as sensor area 310, of the layer can be printed with a conductive fusing ink containing conductive particles. The conductive particles can be capable of absorbing energy from electromagnetic radiation and converting the energy to heat. A non-sensor area 340 can be printed with a fusing ink that includes a fusing agent capable of absorbing energy from electromagnetic radiation and converting the energy to heat. The layer of thermoplastic polymer particles can then be exposed to electromagnetic radiation to raise the temperature of the layer, causing the polymer particles and the conductive particles to fuse together.

Figure 4:
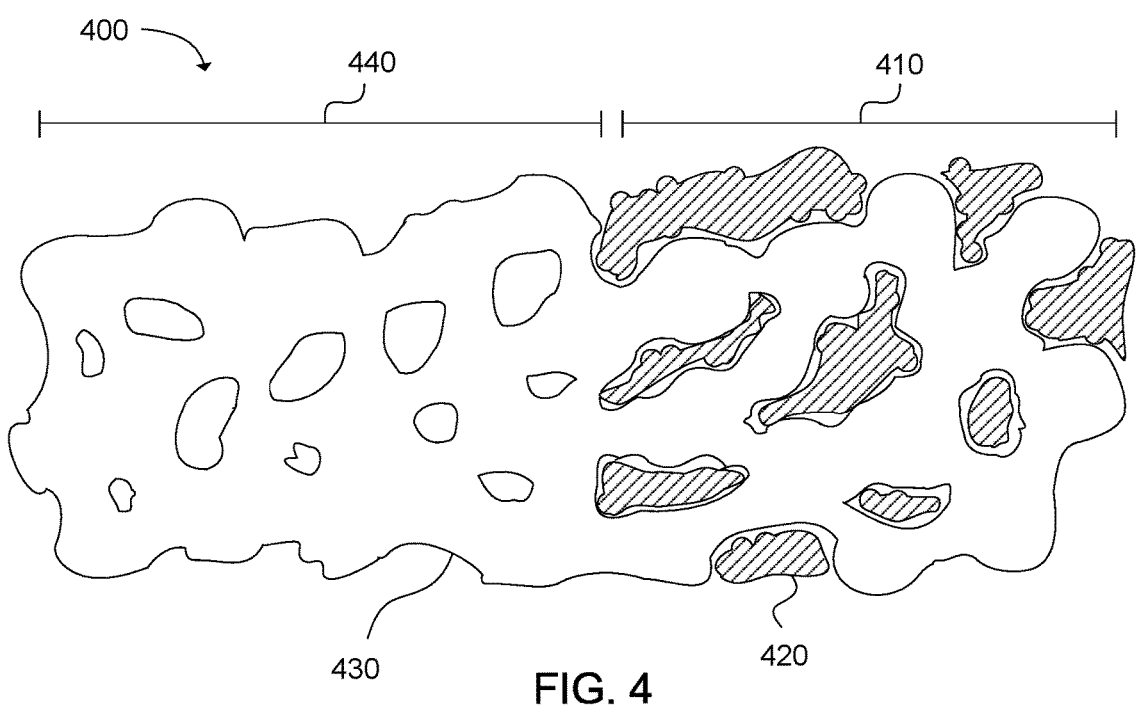
FIG. 4 represents a layer of composite material after fusing, which can be used to prepare a 3-dimensional printed load cell part in accordance with examples of the present disclosure.

FIG. 4 shows the layer 400 after fusing. The polymer particles fuse together to form a matrix of fused thermoplastic polymer particles 430, and the conductive particles fuse or sinter together to form a matrix of conductive particles 420. The matrix of fused thermoplastic polymer particles and the matrix of conductive particles are interlocked, forming a conductive composite. Additionally, the conductive composite is present only in the sensor area 410 where the conductive ink was printed, and not in the non-sensor region 440 where the second fusing ink was printed.

It should be noted that these figures are not necessarily drawn to scale, and the relative sizes of powder particles and conductive particles can differ from those shown. For example, in many cases the conductive particles can be much smaller than the powder particles, such as 2-3 orders of magnitude smaller.

It should also be noted that FIG. 4 shows only a 2-dimensional cross-section of a single layer of the conductive composite. Although the conductive particles appear to be in isolated locations in the figure, the matrix of fused or sintered conductive particles can be a continuously connected matrix in three dimensions. Thus, the conductive composite can have good electrical conductivity through the matrix of conductive particles.

Further, multiple layers of the conductive composite can be formed such that the conductive composite can have good electrical conductivity across multiple layers of the conductive composite (i.e. in the z-axis direction). Thus, in some examples, one or more of the plurality of strain sensors can be oriented at least partially in the z-axis direction such that the one or more strain sensors extends across multiple layers of the 3D printed load cell part. Additionally, because the 3D printed load cell part has a plurality of strain sensors, each of the individual strain sensors can be formed across the same multiple layers or across different multiple layers. For example, a first set of the plurality of strain sensors can be formed exclusively across a number of upper layers of the 3D printed load cell part. In contrast, a second set of the plurality of strain sensors can be formed exclusively across a number of lower layers of the 3D printed load cell part such that there is no layer overlap between the two sets. In other examples, the second set of strain sensors can be formed across some layers in which the first set of strain sensors is formed and some layers in which the first set of strain sensors is not formed. In other examples, the second set of strain sensors can be formed across the same layers as the first set of strain sensors, but also additional layers in which the first set of strain sensors is not formed. Therefore, so long as the first set and the second set of strain sensors are not formed exclusively across the same layers of the 3D printed load cell part, the first set of strain sensors is formed across different layers than the second set of strain sensors. It should be noted that a set of strain sensors can include 1, 2, or more strain sensors.

The conductive particles used to form the plurality of strain sensors can include any suitable 3D printable conductive particles. For example, the conductive particles can include electrically conductive polymers, metals, carbon allotropes, the like, and combinations thereof. Carbon allotropes can include single-walled carbon nanotubes, multi-walled carbon nanotubes, graphene, buckyballs, graphite, carbon black, etc., and combinations thereof.

In some specific examples, the conductive fusing ink can include a transition metal. In some examples, the transition metal can be in the form of elemental transition metal particles. The elemental transition metal particles can include, for example, silver particles, copper particles, gold particles, platinum particles, palladium particles, chromium particles, nickel particles, zinc particles, or combinations thereof. The particles can also include alloys of more than one transition metal, such as Au—Ag, Ag—Cu, Ag—Ni, Au—Cu, Au—Ni, Au—Ag—Cu, or Au—Ag—Pd.

In certain examples, other non-transition metals can be included in addition to the transition metal. The non-transition metals can include lead, tin, bismuth, indium, gallium, and others. In some examples, soldering alloys can be included. The soldering alloys can include alloys of lead, tin, bismuth, indium, zinc, gallium, silver, copper, in various combinations. In certain examples, such soldering alloys can be printed in locations that are to be used as soldering connections for printed electrical components. The soldering alloys can be formulated to have low melting temperatures useful for soldering, such as less than 230° C.

In further examples, the elemental transition metal particles can be nanoparticles having an average particle size from 10 nm to 200 nm. In more specific examples, the elemental transition metal particles can have an average particle size from 30 nm to 70 nm. As metal particles are reduced in size, the temperature at which the particles are capable of being sintered can also be reduced. Therefore, using elemental transition metal nanoparticles in the conductive fusing ink can allow the particles to sinter and form a conductive matrix of sintered nanoparticles at relatively low temperatures. For example, the elemental transition metal particles in the conductive fusing ink can be capable of being sintered at or below the temperature reached during curing in the 3-dimensional printing process. In a further example, the thermoplastic polymer powder bed can be heated to a preheat temperature during the printing process, and the elemental transition metal particles can be capable of being sintered at or below the preheat temperature. In still further examples, the elemental transition metal particles can be capable of being sintered at a temperature from 20° C. to 350° C. As used herein, the temperature at which the elemental transition metal particles are capable of being sintered refers to the lowest temperature at which the particles will become sintered together, forming a conductive matrix of sintered particles. It is understood that temperatures above this lowest temperature will also cause the particles to become sintered.

In additional examples of the conductive fusing ink, the transition metal can be in the form of elemental transition metal particles that are stabilized by a dispersing agent at surfaces of the particles. The dispersing agent can include ligands that passivate the surface of the particles. Suitable ligands can include a moiety that binds to the transition metal. Examples of such moieties can include sulfonic acid, phosphonic acid, carboxylic acid, dithiocarboxylic acid, phosphonate, sulfonate, thiol, carboxylate, dithiocarboxylate, amine, and others. In some cases, the dispersing agent can contain an alkyl group having from 3-20 carbon atoms, with one of the above moieties at an end of the alkyl chain. In certain examples, the dispersing agent can be an alkylamine, alkylthiol, or combinations thereof. In further examples, the dispersing agent can be a polymeric dispersing agent, such as polyvinylpyrrolidone (PVP), polyvinylalcohol (PVA), polymethylvinylether, poly(acrylic acid) (PAA), nonionic surfactants, polymeric chelating agents, and others. The dispersing agent can bind to the surfaces of the elemental transition metal particles through chemical and/or physical attachment. Chemical bonding can include a covalent bond, hydrogen bond, coordination complex bond, ionic bond, or combinations thereof. Physical attachment can include attachment through van der Waal's forces, dipole-dipole interactions, or a combination thereof.

In further examples, the conductive fusing ink can include a transition metal in the form of a metal salt or metal oxide. Under certain conditions, a transition metal salt or metal oxide in the conductive ink can form elemental transition metal particles in situ after being printed onto the thermoplastic polymer powder bed. The elemental transition metal particles thus formed can then be sintered together to form a conductive matrix. In some examples, a reducing agent can be reacted with the metal salt or metal oxide to produce elemental metal particles. In one example, a reducing agent can be underprinted onto the powder bed before the conductive fusing ink. In another example, a reducing agent can be overprinted over the conductive fusing ink. In either case, the reducing agent can be reacted with the metal salt or metal oxide to form elemental metal particles before the thermoplastic polymer particle layer is cured. Suitable reducing agents can include, for example, glucose, fructose, maltose, maltodextrin, trisodium citrate, ascorbic acid, sodium borohydride, ethylene glycol, 1,5-pentanediol, 1,2-propylene glycol, and others.

In other examples, the conductive fusing ink can include a conductive polymer. Non-limiting examples of conductive polymers can include poly(3,4-ethylenedioxythiophene) (PEDOT), polyaniline (PANI), polythiophene, polypyrrole, etc., or a combination thereof. The level of conductivity of a conductive polymer can depend of the level of doping or oxidation of the conductive polymer. Thus, while many conductive polymers are used as semiconductors, they can be doped with conductive materials to increase their conductivity. Further, conductive polymers with low water solubility can be further functionalized with hydrophilic moieties to increase their water solubility. Thus, a large variety of conductive polymers, or combinations thereof, can be employed as conductive particles.

The concentration of conductive particles in the conductive fusing ink can vary. However, higher conductive particle concentrations can tend to provide better conductivity due to a larger amount of conductive material being deposited on the powder bed. In some examples, the conductive fusing ink can contain from about 5 wt % to about 50 wt % of conductive particles, with respect to the entire weight of the conductive fusing ink. In further examples, the conductive fusing ink can contain from about 10 wt % to about 30 wt % of conductive particles, with respect to the entire weight of the conductive fusing ink.

In some examples of the present technology, an activating ink can be used with the conductive fusing ink. A variety of activating agents can be used with activating inks. For example, activating agents can include halogen salts, acids, bases, various solvents, and combinations thereof. In one specific example, where the conductive fusing ink includes a transition metal, the activating ink can include a halogen salt, such as sodium chloride, potassium chloride, potassium bromide, or potassium iodide, for example. The halogen salt can react with dispersing agents at the surfaces of transition metal particles to remove the dispersing agents from the particles. This can increase the sintering between the metal particles and improve the conductivity of the matrix formed of the sintered particles. The activating ink can be dispensed onto the powder bed before the conductive fusing ink. When the conductive fusing ink is printed over the activating ink, the transition metal particles can come into contact with the halogen salt in the activating ink. In alternate examples, the polymer powder can be pretreated with a halogen salt before being used in the 3-dimensional printing system. When the conductive fusing ink is printed onto the powder bed, the transition metal particles in the conductive fusing ink can come into contact with the halogen salt already present on the powder.

As one specific alternative example of an activating agent, the conductive polymer PEDOT can be activated with polystyrenesulfonate (PSS) or other suitable activating agent. Other conductive polymers can be activated with a variety of dopants, such as carbon allotropes, acids, bases, and the like. All such activating agents are considered within the scope of the current disclosure.

The conductive particles can be interlocked with a matrix of thermoplastic polymer particles. The thermoplastic polymer particles also form the main body of the 3D printed load cell part. The thermoplastic polymer powder can include powder particles with an average particle size from 20 µm to 100 µm. As used herein, "average" with respect to properties of particles refers to a number average unless otherwise specified. Accordingly, "average particle size" refers to a number average particle size. Additionally, "particle size" refers to the diameter of spherical particles, or to the longest dimension of non-spherical particles.

In certain examples, the polymer particles can have a variety of shapes, such as substantially spherical particles or irregularly-shaped particles. In some examples, the polymer powder can be capable of being formed into 3D printed parts with a resolution of 20 to 100 microns. As used herein, "resolution" refers to the size of the smallest feature that can be formed on a 3D printed part.

The polymer powder can form layers from about 20 to about 100 microns thick, allowing the fused layers of the printed part to have roughly the same thickness. This can provide a resolution in the z-axis direction of about 20 to about 100 microns. The polymer powder can also have a sufficiently small particle size and sufficiently regular particle shape to provide about 20 to about 100 micron resolution along the x-axis and y-axis.

In some examples, the thermoplastic polymer powder can be colorless. For example, the polymer powder can have a white, translucent, or transparent appearance. When used with a colorless fusing ink, such polymer powders can provide a printed part that is white, translucent, or transparent. In other examples, the polymer powder can be colored for producing colored parts. In still other examples, when the polymer powder is white, translucent, or transparent, color can be imparted to the part by the fusing ink or another colored ink.

The thermoplastic polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be selected from the group consisting of nylon 6 powder, nylon 9 powder, nylon 11 powder, nylon 12 powder, nylon 66 powder, nylon 612 powder, polyethylene powder, thermoplastic polyurethane powder, polypropylene powder, polyester powder, polycarbonate powder, polyether ketone powder, polyacrylate powder, polystyrene powder, and mixtures thereof. In a specific example, the polymer powder can be nylon 12, which can have a melting point from about 175° C. to about 200° C. In another specific example, the polymer powder can be thermoplastic polyurethane.

The thermoplastic polymer particles can also in some cases be blended with a filler. The filler can include inorganic particles such as alumina, silica, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from 10:1 to 1:2 or from 5:1 to 1:1.

A second fusing ink can be added to the thermoplastic polymer particles to form a matrix of fused thermoplastic polymer particles upon exposure to a specified wavelength and/or sufficient intensity of electromagnetic radiation. In some examples, the second fusing ink can be devoid or substantially devoid of the conductive particles contained in the conductive fusing ink. Thus, the second fusing ink can provide a lower conductivity than the conductive fusing ink when printed on the thermoplastic polymer powder. However, in some examples the second fusing ink can include metal particles that provide a lower conductivity than the conductive particles in the conductive fusing ink. For example, the second fusing ink can include metal particles with passivated surfaces that do not sinter together to form a conductive matrix.

The second fusing ink can contain a fusing agent that is capable of absorbing electromagnetic radiation to produce heat. The fusing agent can be colored or colorless. In various examples, the fusing agent can be carbon black, near-infrared absorbing dyes, near-infrared absorbing pigments, tungsten bronzes, molybdenum bronzes, metal nanoparticles, or combinations thereof. Examples of near-infrared absorbing dyes include aminium dyes, tetraaryldiamine dyes, cyanine dyes, pthalocyanine dyes, dithiolene dyes, and others. In further examples, the fusing agent can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the fusing agent can have a peak absorption wavelength in the range of 800 nm to 1400 nm.

The amount of fusing agent in the second fusing ink can vary depending on the type of fusing agent. In some examples, the concentration of fusing agent in the second fusing ink can be from 0.1 wt % to 20 wt %. In one example, the concentration of fusing agent in the second fusing ink can be from 0.1 wt % to 15 wt %. In another example, concentration can be from 0.1 wt % to 8 wt %. In yet another example, the concentration can be from 0.5 wt % to 2 wt %. In a particular example, the concentration can be from 0.5 wt % to 1.2 wt %.

In some examples, the fusing ink can have a black or gray color due to the use of carbon black as the fusing agent. However, in other examples the fusing ink can be colorless or nearly colorless. The concentration of the fusing agent can be adjusted to provide a fusing ink in which the visible color of the fusing ink is not substantially altered by the fusing agent. Although some of the above described fusing agents have low absorbance in the visible light range, the absorbance is usually greater than zero. Therefore, the fusing agents can typically absorb some visible light, but their color in the visible spectrum can minimal enough that it does not substantially impact the ink's ability to take on another color when a colorant is added (unlike carbon black which dominates the ink's color with gray or black tones). The fusing agents in concentrated form can have a visible color, but the concentration of the fusing agents in the fusing ink can be adjusted so that the fusing agents are not present in such high amounts that they alter the visible color of the fusing ink. For example, a fusing agent with a very low absorbance of visible light wavelengths can be included in greater concentrations compared to a fusing agent with a relatively higher absorbance of visible light. These concentrations can be adjusted based on a specific application with some experimentation.

In further examples, the concentration of the fusing agent can be high enough that the fusing agent impacts the color of the fusing ink, but low enough that when the ink is printed on the thermoplastic polymer powder, the fusing agent does not impact the color of the powder. The concentration of the fusing agent can be balanced with the amount of fusing ink that is to be printed on the polymer powder so that the total amount of fusing agent that is printed onto the polymer powder is low enough that the visible color of the polymer powder is not impacted. In one example, the fusing agent can have a concentration in the fusing ink such that after the fusing ink is printed onto the polymer powder, the amount of fusing agent in the polymer powder is from 0.0003 wt % to 5 wt % with respect to the weight of the polymer powder.

The fusing agent can have a temperature boosting capacity sufficient to increase the temperature of the polymer powder above the melting or softening point of the polymer powder. As used herein, "temperature boosting capacity" refers to the ability of a fusing agent to convert near-infrared light energy into thermal energy to increase the temperature of the printed polymer powder over and above the temperature of the unprinted portion of the polymer powder. Typically, the polymer powder particles can be fused together when the temperature increases to the melting or softening temperature of the polymer. As used herein, "melting point" refers to the temperature at which a polymer transitions from a crystalline phase to a pliable, amorphous phase. Some polymers do not have a melting point, but rather have a range of temperatures over which the polymers soften. This range can be segregated into a lower softening range, a middle softening range and an upper softening range. In the lower and middle softening ranges, the particles can coalesce to form a part while the remaining polymer powder remains loose. If the upper softening range is used, the whole powder bed can become a cake. The "softening point," as used herein, refers to the temperature at which the polymer particles coalesce while the remaining powder remains separate and loose. When the fusing ink is printed on a portion of the polymer powder, the fusing agent can heat the printed portion to a temperature at or above the melting or softening point, while the unprinted portions of the polymer powder remain below the melting or softening point. This allows the formation of a solid 3D printed part, while the loose powder can be easily separated from the finished printed part.

Although melting point and softening point are often described herein as the temperatures for coalescing the polymer powder, in some cases the polymer particles can coalesce together at temperatures slightly below the melting point or softening point. Therefore, as used herein "melting point" and "softening point" can include temperatures slightly lower, such as up to about 20° C. lower, than the actual melting point or softening point.

In one example, the fusing agent can have a temperature boosting capacity from about 10° C. to about 70° C. for a polymer with a melting or softening point from about 100° C. to about 350° C. If the powder bed is at a temperature within about 10° C. to about 70° C. of the melting or softening point, then such a fusing agent can boost the temperature of the printed powder up to the melting or softening point, while the unprinted powder remains at a lower temperature. In some examples, the powder bed can be preheated to a temperature from about 10° C. to about 70° C. lower than the melting or softening point of the polymer. The fusing ink can then be printed onto the powder and the powder bed can be irradiated with a near-infrared light to coalesce the printed portion of the powder.

In some examples of the present technology, the conductive fusing ink and the second fusing ink can be balanced so that thermoplastic polymer powder that is printed with the conductive fusing ink and the second fusing ink reach nearly the same temperature when exposed to light during curing. The type and amount of fusing agent in the second fusing ink can be selected to match the temperature boosting capacity of the conductive particles in the conductive fusing ink. The type and amount of conductive particles in the conductive fusing ink can also be adjusted to match the temperature boosting capacity of the fusing agent in the second fusing ink. Additionally, in some examples the conductive fusing ink can also contain a fusing agent in addition to the conductive particles, which can be the same fusing agent or a different fusing agent as that used in the second fusing ink. In certain examples, the conductive fusing ink and the second fusing ink can raise the temperature of the thermoplastic polymer powder to temperatures within 30° C., within 20° C., or within 10° C. of each other during curing.

In further examples, colored inks can also be used for adding color to the thermoplastic polymer powder. This can allow for printing of full-color 3-dimensional parts. In one example, the cyan, magenta, yellow, and black inks can be used in addition to the conductive fusing ink, second fusing ink, and activating ink if present. Alternatively, any of the above described inks can also include a pigment or dye colorant that imparts a visible color to the inks.

Each of the conductive fusing ink, activating ink, second fusing ink, and additional colored inks can be formulated for use in an ink jet printer. The conductive particles and fusing agents can be stable in an ink jet ink vehicle and the inks can provide good ink jetting performance. In some examples, the conductive particles and fusing agents can be water-soluble, water-dispersible, organic-soluble, or organic-dispersible. The conductive particles and fusing agents can also be compatible with the thermoplastic polymer powder so that jetting the inks onto the polymer powder provides adequate coverage and interfiltration of the conductive particles and fusing agents into the powder.

Besides the conductive particles, fusing agents, colorants, and other ingredients described above, the inks can also include a liquid vehicle. In some examples, the liquid vehicle formulation can include water, one or more co-solvents, one or more non-ionic, cationic, and/or anionic surfactant, dispersants, biocides, viscosity modifiers, materials for pH adjustment, sequestering agents, preservatives, the like, or combinations thereof.

Figure 5:
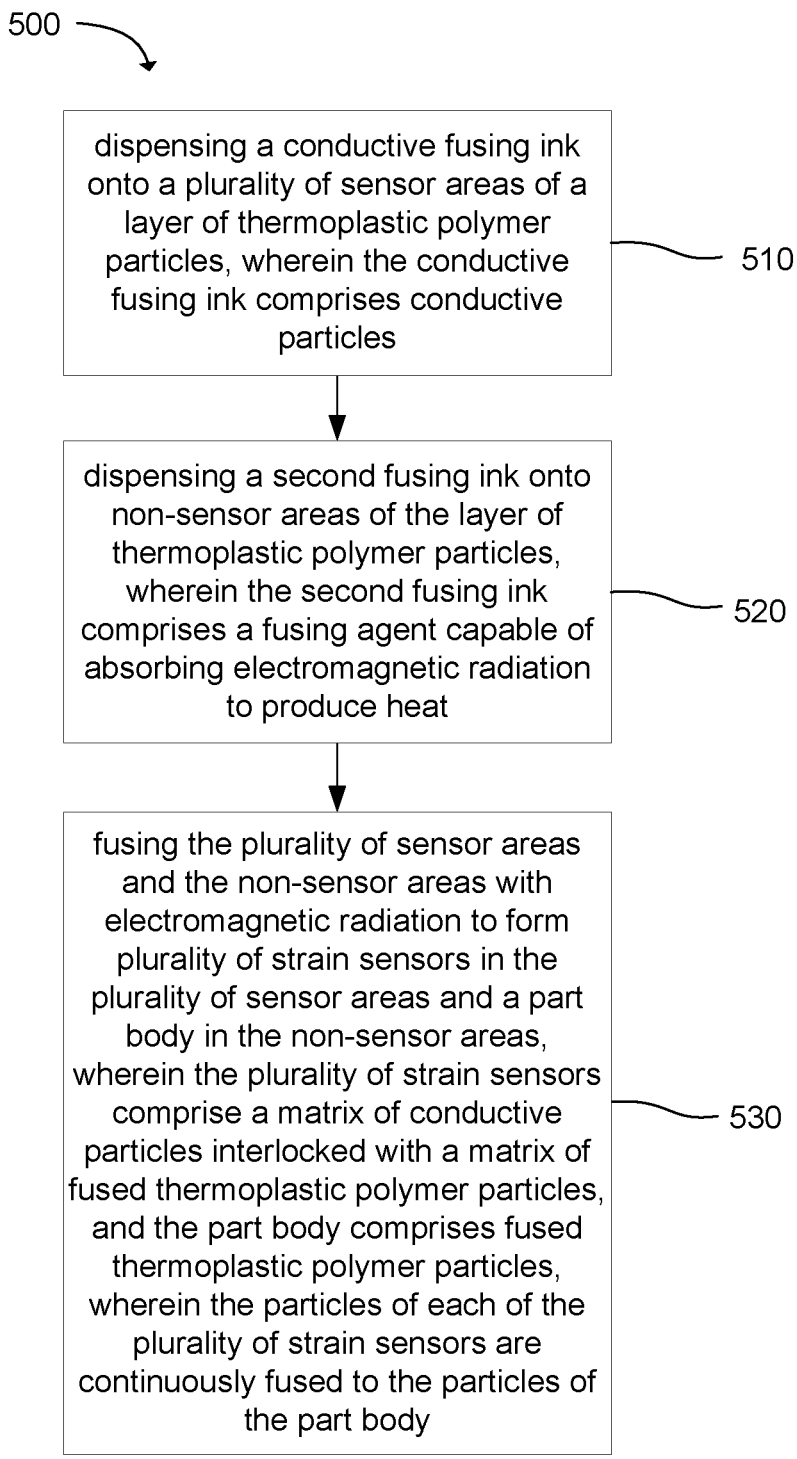
FIG. 5 depicts a flow chart of an example method of preparing a 3-dimensional printed load cell part in accordance with examples of the present disclosure.

Various methods of making 3D load cell parts can use any of the materials described above in any suitable combination. FIG. 5 depicts a flowchart of one example of a method 500 of making a 3-dimensional printed load cell part having a plurality of integrated strain sensors. The method includes dispensing a conductive fusing ink onto a plurality of sensor areas of a layer of thermoplastic polymer particles, wherein the conductive fusing ink includes conductive particles 510; dispensing a second fusing ink onto non-sensor areas of the layer of thermoplastic polymer particles, wherein the second fusing ink includes a fusing agent capable of absorbing electromagnetic radiation to produce heat 520; and fusing the plurality of sensor areas and the non-sensor areas with electromagnetic radiation to form a plurality of strain sensors in the plurality of sensor areas and a part body in the non-sensor areas, wherein the plurality of strain sensors include a matrix of conductive particles interlocked with a matrix of fused thermoplastic polymer particles, and the part body includes fused thermoplastic polymer particles, wherein the particles of each of the plurality of strain sensors are continuously fused to the particles of the part body 530.

In further examples, methods of making 3-dimensional printed load cell parts having a plurality of integrated strain sensors can include dispensing additional inks onto the thermoplastic polymer particles. In some examples, the fusing inks, and other inks described herein, can be dispensed by ink jetting. This can be performed by a thermal ink jet printing system or a piezo ink jet printing system. Any other suitable method of dispensing the inks onto the polymer particles can also be used.

In additional examples, the methods described herein can be performed using a powder bed 3-dimensional printing system. In one example, the bed of the thermoplastic polymer particles can be formed by introducing polymer powder from a polymer powder supply and rolling the powder in a thin layer using a roller. The conductive fusing ink and second fusing ink can be jetted using ink jet print heads. The amount of conductive ink printed can be calibrated based on the concentration of conductive particles in the ink, the temperature boosting capacity of the conductive particles, the desired conductivity of the resulting conductive composite material to be printed, among other factors. Similarly, the amount of the second fusing ink printed can be calibrated based the concentration of fusing agent, temperature boosting capacity of the fusing agent, and other factors. In some examples, the amount of fusing ink printed can be sufficient to contact a fusing agent with the entire layer of polymer powder. For example, if each layer of polymer powder is 100 microns thick, then the fusing ink can penetrate at least 100 microns into the polymer powder. Thus the fusing agents can heat the polymer powder throughout the entire layer so that the layer can coalesce and bond to the layer below. After forming a solid layer, a new layer of loose powder can be formed, either by lowering the powder bed or by raising the height of the roller and rolling a new layer of powder.

The entire powder bed can be preheated to a temperature below the melting or softening point of the polymer powder. In one example, the preheat temperature can be from about 10° C. to about 30° C. below the melting or softening point. In another example, the preheat temperature can be within 50° C. of the melting of softening point. In a particular example, the preheat temperature can be from about 160° C. to about 170° C. and the polymer powder can be nylon 12 powder. In another example, the preheat temperature can be about 90° C. to about 100° C. and the polymer powder can be thermoplastic polyurethane. Preheating can be accomplished with one or more lamps, an oven, a heated support bed, or other types of heaters. In some examples, the entire powder bed can be heated to a substantially uniform temperature.

The powder bed can be irradiated with a fusing lamp. Suitable fusing lamps for use in the methods described herein can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing inks leaving the unprinted portions of the polymer powder below the melting or softening point.

In one example, the fusing lamp can be matched with the fusing agents in the fusing inks so that the fusing lamp emits wavelengths of light that match the peak absorption wavelengths of the fusing agents. A fusing agent with a narrow peak at a particular near-infrared wavelength can be used with a fusing lamp that emits a narrow range of wavelengths at approximately the peak wavelength of the fusing agent. Similarly, a fusing agent that absorbs a broad range of near-infrared wavelengths can be used with a fusing lamp that emits a broad range of wavelengths. Matching the fusing agent and the fusing lamp in this way can increase the efficiency of coalescing the polymer particles with the fusing agent printed thereon, while the unprinted polymer particles do not absorb as much light and remain at a lower temperature.

Depending on the amount of fusing agent present in the polymer powder, the absorbance of the fusing agent, the preheat temperature, and the melting or softening point of the polymer, an appropriate amount of irradiation can be supplied from the fusing lamp. In some examples, the fusing lamp can irradiate each layer from about 0.5 to about 10 seconds per pass.

In further examples, methods of making 3-dimensional printed load cell parts having a plurality of integrated strain sensors can include tuning the resistance of the 3-dimensional printed strain sensors to a desired range. As explained above, the strain sensors can have the form of a conductive composite with a matrix of fused thermoplastic polymer particles interlocked with a matrix of conductive particles. The resistance of the conductive composite can be tuned in a variety of ways. For example, the resistance can be affected by the type of conductive particles in the conductive fusing ink, the concentration of the conductive particles in the conductive fusing ink, the amount of conductive fusing ink dispensed onto the powder bed, the cross section and length of the resistor, and so on. When the conductive fusing ink is dispensed by ink jetting, the amount of conductive fusing ink dispensed can be adjusted by changing print speed, drop weight, number of slots from which the ink is fired in the ink jet printer, and number of passes printed per powder layer. In certain examples, a conductive composite element can have a resistance from 1 ohm, 5 ohms, or 10 ohms to 0.1 megaohms, 1 megaohm, or 5 megaohms.

Sufficient conductivity can be achieved by dispensing a sufficient amount of the conductive particles onto the powder bed. For example, the mass of conductive particles per volume of conductive composite can be greater than 1 mg/cm$^3$, greater than 10 mg/cm$^3$, greater than 50 mg/cm$^3$, or greater than 100 mg/cm$^3$. In a particular example, the mass of conductive particles per volume of the conductive composite can be greater than 140 mg/cm$^3$. In further examples, the mass of conductive particles per volume of conductive composite can be from 1 mg/cm$^3$ to 1000 mg/cm$^3$, from 10 mg/cm$^3$ to 1000 mg/cm$^3$, from 50 mg/cm$^3$ to 500 mg/cm$^3$, or from 100 mg/cm$^3$ to 500 mg/cm$^3$.

In certain examples, a smaller amount of conductive particles can be dispensed to achieve surface conductivity, and a larger amount of conductive particles can be applied to achieve bulk conductivity in the conductive composite. Thus, in some examples a smaller amount of conductive fusing ink can be printed on a single layer of polymer particles to form a strain sensor that has conductivity across the surface of the layer, i.e., in the x-y plane. In some examples, strain sensors with conductivity in the x-y plane can be formed with a mass of conductive particles per volume of conductive composite that is greater than 1 mg/cm$^3$ or greater than 10 mg/cm$^3$. In further examples, such strain sensors can be formed with a mass of conductive particles per volume of conductive composite from 1 mg/cm$^3$ to 1000 mg/cm$^3$, 10 mg/cm$^3$ to 500 mg/cm$^3$, or 30 mg/cm$^3$ to 200 mg/cm$^3$. However, such strain sensors may not have sufficient conductivity in the z-axis direction, or in other words, through the bulk of the layer. As used herein, the "z-axis" refers to the axis orthogonal to the x-y plane. For example, in 3-dimensional printing methods that use a powder bed that lowers after each layer is printed, the powder bed is lowered in the z-axis direction.

In some examples, a strain sensor that is conductive only in the x-y plane can be sufficient. This is the case when the strain sensor is formed parallel to the layers of the 3-dimensional printed load cell part. However, methods according to the present technology can also be used to print strain sensors that are conductive in the z-axis direction. By dispensing a larger amount of conductive fusing ink onto the layer of polymer particles, the conductive ink can penetrate through the layer and conductivity between layers in the z-axis direction can be achieved. In some examples, strain sensors that are conductive in the z-axis direction can be formed with a mass of conductive particles per volume of conductive composite that is greater than 50 mg/cm$^3$ or greater than 100 mg/cm$^3$. In further examples, such strain sensors can be formed with a mass of conductive particles per volume of conductive composite from 50 mg/cm$^3$ to 1000 mg/cm$^3$, 100 mg/cm$^3$ to 1000 mg/cm$^3$, or 140 mg/cm$^3$ to 500 mg/cm$^3$.

In some examples, the amount of conductive particles dispensed onto the powder bed can be adjusted by printing the conductive fusing ink in multiple passes. In one example, a single pass of an inkjet print head can be sufficient to dispense enough conductive particles to achieve surface conductivity. However, in some cases, a single pass is not sufficient to achieve conductivity in the z-axis direction. Additional passes can be applied to increase the amount of conductive particles in the conductive composite. A sufficient number of passes can be used to achieve conductivity in the z-axis direction. In one example, three or more passes can be used to form a conductive composite with conductivity in the z-axis direction. In further examples, the amount of conductive particles dispensed can be adjusted by adjusting the drop weight of the inkjet printhead either through resistor design or by changing firing parameters. Thus, with a greater drop weight, a greater amount of the conductive fusing ink can be printed with each drop fired. However, in some cases jetting too large an amount of ink in a single pass can lead to lower print quality because of ink spreading. Therefore, in some examples multiple passes can be used to print more of the conductive fusing ink with better print quality In a particular example, a 3-dimensional printed load cell part can be formed as follows. An inkjet printer can be used to print a first pass including printing a conductive fusing ink onto a plurality of sensor areas of the powder bed and printing a second fusing ink onto non-sensor areas of the powder bed. A curing pass can then be performed by passing a fusing lamp over the powder bed to fuse the polymer particles and the conductive particles in the conductive fusing ink. Then, one or more additional passes can be performed of printing the conductive fusing ink onto the plurality of sensor areas of the powder bed to increase the amount of conductive particles. Each pass of printing the conductive fusing ink can be followed by a curing pass with the fusing lamp. The number of passes used can depend on the desired conductivity, the contone level of the printing passes (referring to the density of ink per area deposited on each pass), the type of conductive particles in the conductive fusing ink, concentration of conductive particles in the conductive fusing ink, thickness of the layer of polymer powder being printed, and so on.

Accordingly, the methods of the present technology can be used to make 3-dimensional printed load cell parts with a plurality of integrated strain sensors that are oriented in any direction. As explained above, a strain sensor can be formed in the x-y plane with respect to the layers of the 3-dimensional printed load cell part using a relatively smaller amount of conductive fusing ink, while strain sensors oriented in the z-axis direction can be formed by using a relatively greater amount of conductive fusing ink on each layer. As previously described, in some examples, one or more of the plurality of strain sensors can be oriented at least partially in the z-axis direction with respect to the layers of the 3-dimensional printed load cell part. As used herein, "at least partially in the z-axis direction" refers to any direction that has at least a non-zero component on the z-axis. Therefore, resistors can be formed parallel to the z-axis or diagonal to the z-axis using the methods described herein.

Figure 6:
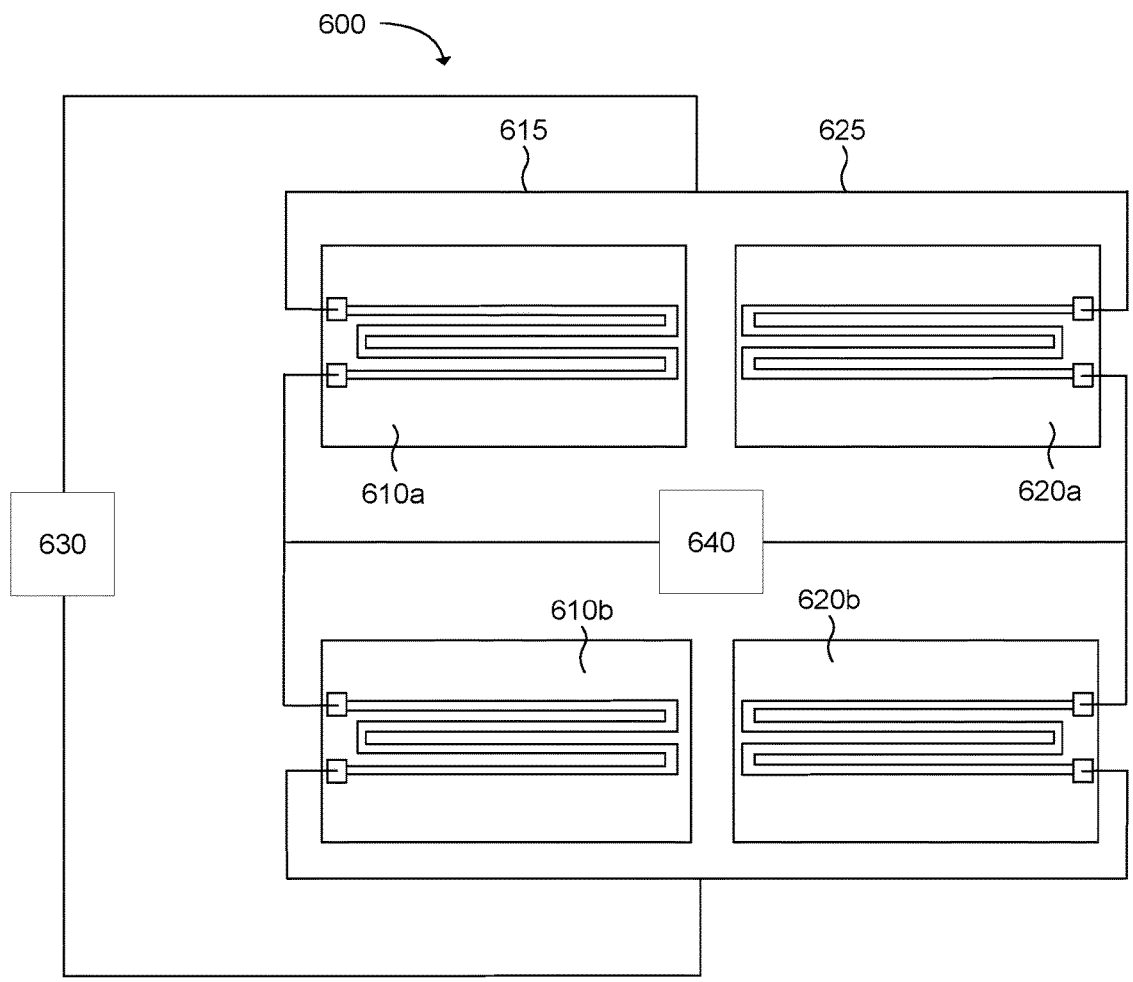
FIG. 6 represents an example of a load cell in accordance with examples of the present disclosure.

The 3-dimensional printing methods described herein can be used to manufacture a wide variety of complex load cell part shapes to be used in a load cell. One example of a load cell 600 is illustrated in FIG. 6. The load cell can include a first set of 3D printed strain sensors 610*a*, 610*b* electrically connected along a first current path 615. A second set of 3D printed strain sensors 620*a*, 620*b* can be electrically connected along a second current path 625. The first and second current paths can generally be parallel current paths in a common electrical circuit. During operation, the load cell can be connected to a power source 630 to supply a current to the load cell. Further, a voltmeter 640 can be electrically connected between the first current path and the second current path using a bridge connection. The voltmeter can measure changes in voltage across the respective current paths due to changes in resistance resulting from tensile forces applied to each of the individual strain sensors. The changes in voltage can be correlated to load or weight measurements, as is known in the art. The various connections between the plurality of strain sensors of the load cell can be made with standard conductive wiring or other suitable electrical connection. Similar connections can be made from the load cell to the power source and voltmeter.

A load cell can generally include two resistors connected along a first current path and two resistors connected along a second current path. One or more of the resistors can be a strain sensor. Where one of the resistors is a strain sensor, the load cell is typically referred to as a quarter-bridge load cell. Where each of the two resistors along one current path are strain sensors, the load cell is typically referred to as a half-bridge load cell. Where all of the resistors are strain sensors, the load cell is typically referred to as a full-bridge load cell. Thus, FIG. 6 illustrates a full-bridge load cell.

As is known in the art, half-bridge and full-bridge load cells can provide a number of advantages over a quarter-bridge load cell. For example, increasing the number of strain sensors in the load cell can increase the sensitivity of the load cell to both the magnitude and direction of a force applied to the load cell. Further, using a plurality of strain sensors can offset the temperature coefficient of resistance for the various strain sensors because each of the strain sensors is printed with the same materials and will be equivalently affected by fluctuations in temperature.

It is noted that, for the sake of simplicity, FIG. 6 illustrates four separate 3-dimensional printed load cell parts each having a single strain sensor. However, other configurations of 3D printed load cell parts can also be incorporated into a load cell. For example, 3D printed strain sensors 610a and 620a can be printed in a single monolithic part. Likewise, strain sensors 610b and 620b can be printed in a separate monolithic part.

Figure 7:
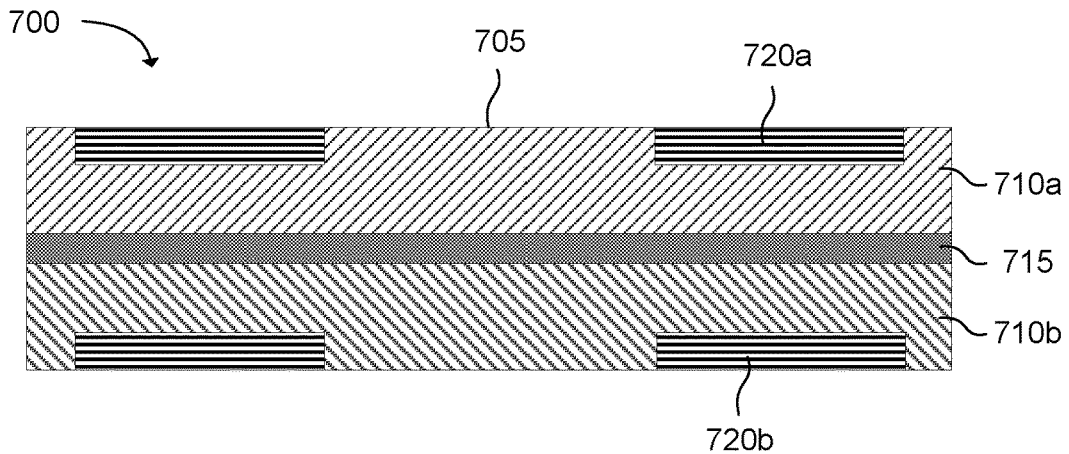
FIG. 7 represents another example of a load cell in accordance with examples of the present disclosure.

This is more clearly illustrated in FIG. 7. In this example, load cell 700 can be formed of two separate 3D printed load cell parts. A first 3D printed load cell part 710a can have a plurality of strain sensors 720a formed in a surface thereof. A second 3D printed load cell part 710b can also have a plurality of strain sensors 720b formed in a surface thereof. An adhesive 715, or other coupling feature, can be applied between each of the first and second 3D printed load cell parts to couple the printed parts to one another or to opposing surfaces of an independent object. As a force is applied to surface 705, the strain sensors 720a will begin to compress and strain sensors 720b will begin to experience tensile stress. This can result in a decrease in resistance across strain sensors 720a and an increase in resistance across strain sensors 720b. When connected to a power source and voltmeter, as illustrated in FIG. 6, these changes in resistance can cause changes in voltage across parallel current paths that can be related to the direction and magnitude of the force being applied to surface 705.

Figure 8:
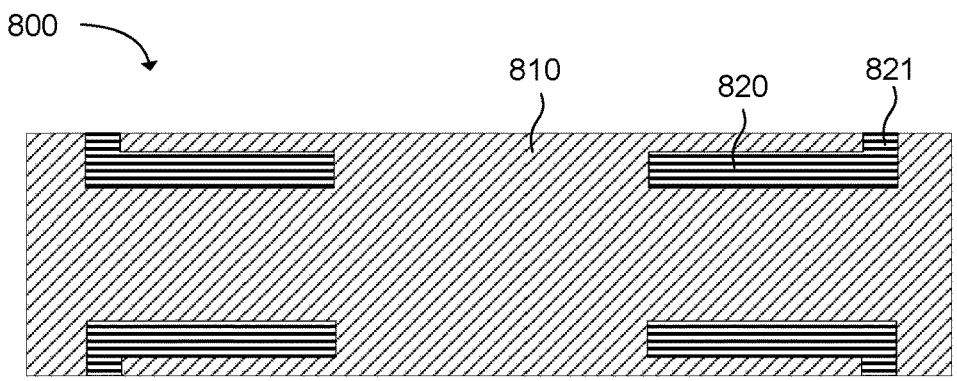
FIG. 8 represents another example of a load cell in accordance with examples of the present disclosure.

Alternatively, as illustrated in FIG. 8, strain sensors 820 of load cell 800 can be printed in a single monolithic part body 810. In this particular example, the strain sensors are embedded within the part body, such that only a plurality of electrical contacts, such as electrical contacts 821, is formed on and/or extend to the surface of the part body. However, in some examples each of the strain sensors can be formed on a surface of the monolithic body.

Figure 9:
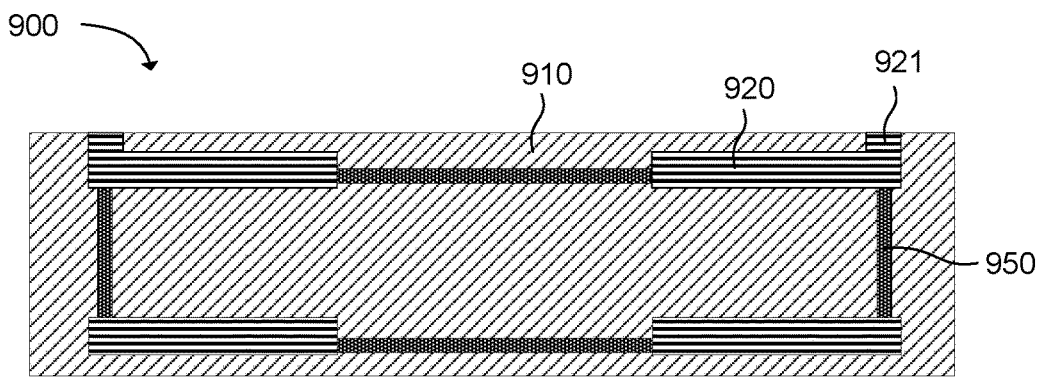
FIG. 9 represents another example of a load cell in accordance with examples of the present disclosure.

FIG. 9 illustrates a load cell 900 that includes embedded internal electrical connections 950. These embedded internal electrical connections can be in the form of traces, vias, the like, or combinations thereof. The embedded internal electrical connections can be formed of the same matrix of conductive particles as the plurality of strain sensors 920, or of a different matrix of conductive particles. Where embedded internal electrical connections are printed within the body 910 of the load cell, the load cell can have a reduced number of electrical contacts, such as electrical contacts 921, which are formed on and/or extend to the surface of the part body. This can reduce the need for external wiring to connect the various strain sensors of the load cell.

It is noted that the wiring configuration of the load cell can depend on which of the plurality of strain sensors will be in tension and which of the plurality of strain sensors will be in compression when a load is applied to the load cell. Thus, the load cell can be wired in a wheatstone bridge configuration such that one strain sensor under compression and one strain sensor under tension are electrically connected along each of the separate current paths. For example, in a three-point bend configuration both, such as those illustrated in FIGS. 7-9, the top strain sensors will be under compression and the bottom strain sensors will be under tension. As such one of each of the top strain sensors would be electrically connected to one of each of the bottom strain sensors along separate current paths. However, where a beam load cell is used, for example, diagonally positioned strain sensors would be in compression/tension. Thus, a beam load cell would have to be wired differently than a three-point bend load cell. Other load cells can have other wiring configurations depending on the strain sensor orientation, position, and intended application.

It is noted that the 3D printed load cells are generally depicted as generic rectangular shapes for the sake of simplicity. However, the load cells can be printed in a large variety of complex shapes and configurations. For example, the 3D printed load cell parts can be printed as a load pin, a load beam, an S-cell, a load button, a rope clamp, or the like. Further, because of the flexibility of 3D printing, a number of standard parts can be printed with load cell components. The various shapes and configurations can be printed as monolithic parts or connectable parts, according to specific design considerations.

It is noted that, as used in this specification and the appended claims, the singular forms "a," "an," and "the" include plural referents unless the context clearly dictates otherwise.

As used herein, "liquid vehicle" or "ink vehicle" refers to a liquid fluid in which colorant is placed to form an ink. A wide variety of ink vehicles may be used with the systems and methods of the present disclosure. Such ink vehicles may include a mixture of a variety of different agents, including, surfactants, solvents, co-solvents, anti-kogation agents, buffers, biocides, sequestering agents, viscosity modifiers, surface-active agents, water, etc. Though not part of the liquid vehicle per se, in addition to the colorants and fusing agents, the liquid vehicle can carry solid additives such as polymers, latexes, UV curable materials, plasticizers, salts, etc.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe not only pigment colorants, but other pigments such as organometallics, ferrites, ceramics, etc. In one specific aspect, however, the pigment is a pigment colorant.

As used herein, "soluble," refers to a solubility percentage of more than 5 wt %.

As used herein, "ink jetting" or "jetting" refers to compositions that are ejected from jetting architecture, such as ink-jet architecture. Ink-jet architecture can include thermal or piezo architecture. Additionally, such architecture can be configured to print varying drop sizes such as less than 10 picoliters, less than 20 picoliters, less than 30 picoliters, less than 40 picoliters, less than 50 picoliters, etc.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context. When using the term "substantial" or "substantially" in the negative, e.g., substantially devoid of a material, what is meant is from none of that material is present, or at most, only trace amounts could be present at a concentration that would not impact the function or properties of the composition as a whole.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

As a further note, in the present disclosure, it is noted that when discussing the 3D printed load cell parts, the method of making 3D printed load cell parts, or the load cell, each of these discussions can be considered applicable to each of these examples, whether or not they are explicitly discussed in the context of that example. Thus, for example, in discussing details about the 3D printed load cell parts per se, such discussion also refers to the method and the load cell, and vice versa.

EXAMPLES

The following illustrates examples of the present disclosure. However, it is to be understood that the following are only illustrative of the application of the principles of the present disclosure. Numerous modifications and alternative devices, methods, and systems may be devised without departing from the spirit and scope of the present disclosure. The appended claims are intended to cover such modifications and arrangements.

Example 1

A 3-dimensional printing system was used to print two separate load cell parts, each part having two unconnected, serpentine-shaped strain sensors printed on a common surface of the part body. A conductive fusing ink, activating ink, and second fusing ink were printed from three separate ink jet pens. The conductive fusing ink was a silver ink (Mitsubishi NBSIJ-MU01) containing silver nanoparticles. The silver nanoparticles had an average particle size of approximately 20 nm. The activating ink was a solution of 3 wt % sodium chloride in water. The second fusing ink included carbon black as the fusing agent and an aqueous ink vehicle.

The inks were jetted onto a bed of nylon (PA12) particles (Vestosint® x1556). The nylon particles had an average particle size of approximately 50 µm. The layer thickness was approximately 100 µm. Each layer was printed with the activating ink followed by the silver ink in the portions that make up the plurality of strain sensors, and the carbon black fusing ink in the insulating portions. The inks were printed at contone levels of 255 for the silver ink, 255 for the activating ink, and 15 for the carbon black ink. 3 passes of the inks were performed for each layer. After each pass with the inks, a curing pass was performed. In this example, the amount of solid silver dispensed onto the powder was 141 mg/cm$^3$ of the powder layer; the amount of chloride salt dispensed was 23 mg/cm$^3$ of the powder layer; and the amount of carbon black dispensed was 2.3 mg/cm$^3$ of the powder layer.

The printer powder supply and powder bed were filled with the nylon particles. The supply temperature was set at 110° C. and the print bed temperature was set at 130° C. A heater under the print bed was set at 150° C. The print speed was set at 10 inches per second (ips) and the cure speed was set at 7 ips. Curing was performed using two 300 W bulbs placed approximately 1 cm away from the surface of the powder bed.

Both of the load cell parts were adhered together with an adhesive in a manner similar to that illustrated in FIG. 7. A first strain sensor from each of the separate 3D printed load cell parts was electrically connected along a first current path and a second strain sensor from each of the separate 3D printed load cell parts was electrically connected along a second current path to prepare a full-bridge load cell. This particular configuration allows each strain sensor from the respective 3D printed parts to be connected along separate current paths. As such, when a force was applied to the load cell, each current path included one compressed strain sensor and one strain sensor under tension.

The load cell circuit was electrically connected to a standard power source to provide an electrical current. A voltmeter was electrically connected between the first current path and the second current path using a bridge connection. The voltmeter was used to detect voltage changes across the various strain sensors as a result of force applied to the load cell.

Figure 10:
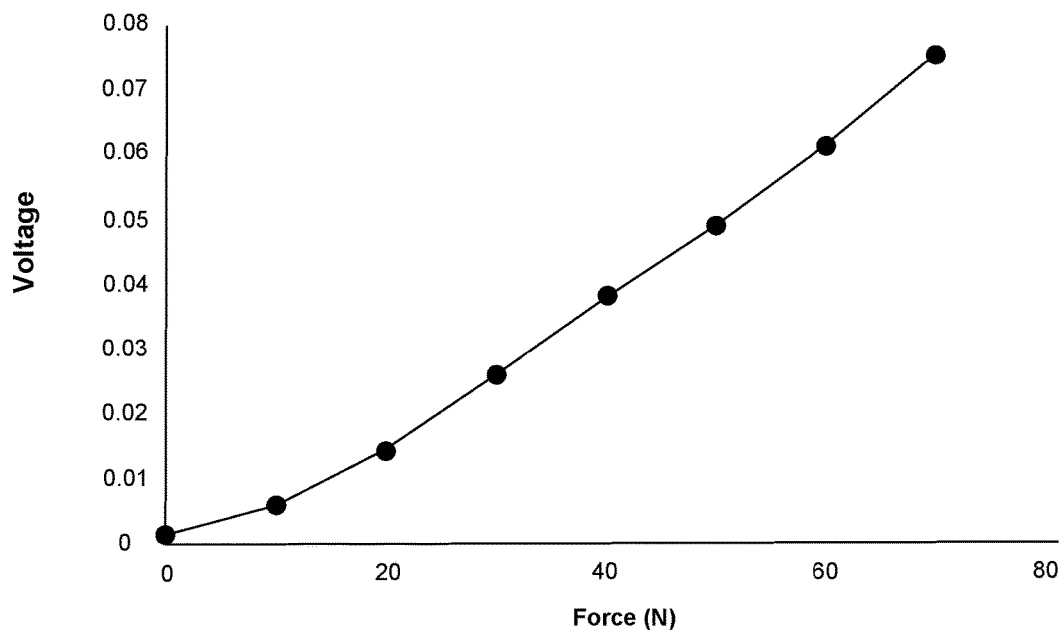
FIG. 10 depicts a graph of the relationship between voltage and force applied to one example of a load cell in accordance with examples of the present disclosure.

FIG. 10 provides a graphical representation of the change in voltage measured in response to a force applied to the load cell. First, a baseline voltage was measured for the load cell prior to application of a force thereto. Subsequently a force was applied to the load cell in 10 Newton (N) increments to measure the corresponding change in voltage across the first and second current paths. As can be seen in FIG. 10, there was a nearly linear relationship between the amount of force applied and the voltage change across the two current paths.

Example 2

The load cell in this example was prepared using the same 3D print materials and 3D print processes as in Example 1.

Further, each of the four strain sensors was interconnected in an arrangement equivalent to the load cell of Example 1. However, in this example, the four strain sensors were printed such that they were each embedded within a single monolithic body. Additionally, embedded internal electrical connections were used to interconnect each of the strain sensors in a full-bride configuration instead of using external wiring. The embedded internal electrical connections were formed from the same materials as the strain sensors. In this particular example, only four electrical connections extended to the surface of the load cell. Two of the connections were used to connect a voltmeter along a bridge connection between the parallel current paths of the load cell. The other two connections were used to connect the load cell to a standard power source. All other interconnections between the plurality of strain sensors were printed within the body of the monolithic load cell.

Figure 11:
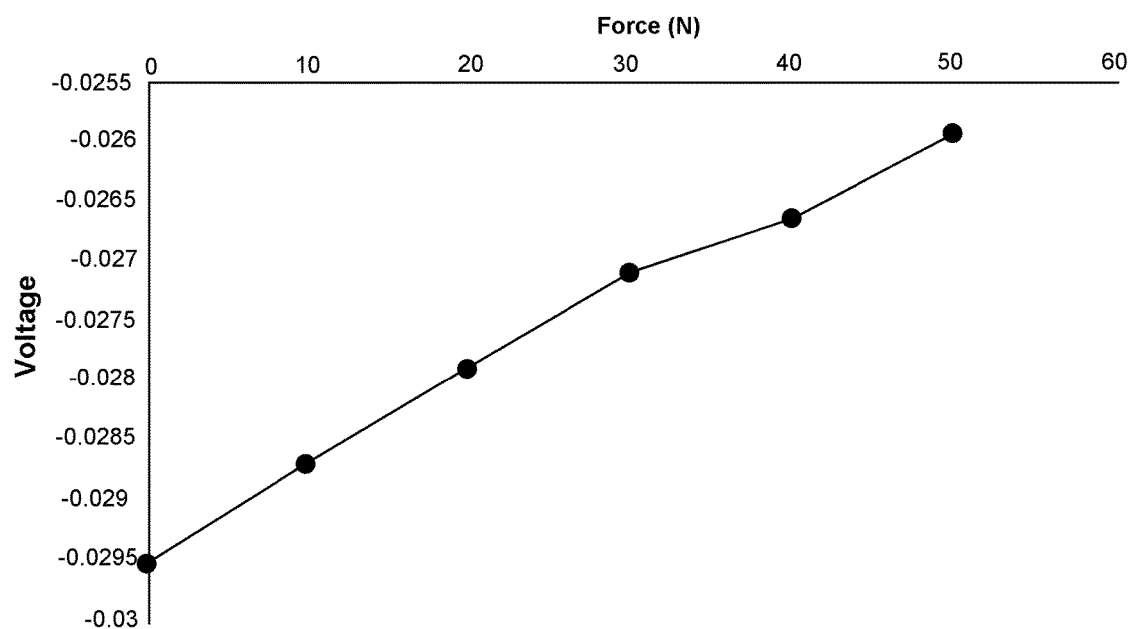
FIG. 11 depicts a graph of the relationship between voltage and force applied to another example of a load cell in accordance with examples of the present disclosure.

This load cell was tested in an equivalent manner to the load cell described in Example 1. FIG. 11 illustrates the correlation of voltage change across the two current paths in response to a force applied to the load cell. As is seen in FIG. 11, this load cell also had a nearly linear response to force applied to the load cell.

What is claimed is:

1. A 3-dimensional printed load cell part, comprising:
   a part body formed of fused thermoplastic polymer particles; and
   a plurality of strain sensors separately formed of a matrix of fused conductive particles interlocked with a matrix of fused thermoplastic polymer particles, the plurality of strain sensors each having a first electrical contact at a first end and a second electrical contact at a second end,
   wherein the particles of the plurality of strain sensors are continuously fused to the particles of the part body.

2. The 3-dimensional printed load cell part of claim 1, wherein the plurality of strain sensors are formed on a surface of the printed part.

3. The 3-dimensional printed load cell part of claim 1, wherein the plurality of strain sensors are embedded in the part body and a plurality of electrical contacts of the plurality of strain sensors are formed on a surface of the printed part.

4. The 3-dimensional printed load cell part of claim 1, wherein each of the strain sensors has a resistance from 1 ohm to 1 megaohm.

5. The 3-dimensional printed load cell part of claim 1, wherein the conductive particles comprise conductive polymers, metals, carbon allotropes, or a combination thereof.

6. The 3-dimensional printed load cell part of claim 1, wherein the fused thermoplastic polymer particles comprise a fusing agent selected from carbon black, a near-infrared absorbing dye, a near-infrared absorbing pigment, a tungsten bronze, a molybdenum bronze, metal nanoparticles, a conjugated polymer, or combinations thereof.

7. The 3-dimensional printed load cell part of claim 1, wherein each of the strain sensors further comprises an activating ink in the matrix of fused conductive particles, the matrix of fused thermoplastic polymer particles, or both.

8. The 3-dimensional printed load cell part of claim 1, wherein the part body is formed of multiple layers of fused thermoplastic polymer particles stacked in a z-axis direction, wherein each of the plurality of strain sensors is oriented at least partially in the z-axis direction, and wherein each of the plurality of strain sensors extends across a plurality of the layers of fused thermoplastic polymer particles of the part body.

9. A method of making a 3-dimensional printed load cell part, comprising:
   dispensing a conductive fusing ink onto a plurality of sensor areas of a layer of thermoplastic polymer particles, wherein the conductive fusing ink comprises conductive particles;
   dispensing a second fusing ink onto non-sensor areas of the layer of thermoplastic polymer particles, wherein the second fusing ink comprises a fusing agent capable of absorbing electromagnetic radiation to produce heat; and
   fusing the plurality of sensor areas and the non-sensor areas with electromagnetic radiation to form a plurality of strain sensors in the plurality of sensor areas and a part body in the non-sensor areas, wherein the plurality of strain sensors comprise a matrix of conductive particles interlocked with a matrix of fused thermoplastic polymer particles and the part body comprises fused thermoplastic polymer particles, and wherein the particles of each of the plurality of strain sensors are continuously fused to the particles of the part body.

10. The method of claim 9, wherein each of the plurality of strain sensors is formed at least partially oriented in a z-axis direction such that each of the strain sensors extends across multiple layers of the 3-dimensional printed load cell part.

11. The method of claim 10, wherein the plurality of strain sensors are formed across the same multiple layers.

12. The method of claim 10, wherein a first set of the plurality of strain sensors are formed across different layers than a second set of the plurality of strain sensors.

13. A load cell, comprising:
   a first set of strain sensors electrically connected along a first current path, the first set of strain sensors being separately formed of a matrix of fused conductive particles interlocked with a matrix of fused thermoplastic polymer particles; and
   a second set of strain sensors electrically connected along a second current path, the second set of strain sensors being separately formed of a matrix of fused conductive particles interlocked with a matrix of fused thermoplastic polymer particles, wherein the first current path and the second current path are parallel current paths in a common electrical circuit.

14. The load cell of claim 13, wherein the first set of strain sensors and the second set of strain sensors are formed as part of a monolithic body.

15. The load cell of claim 14, wherein the first set of strain sensors and the second set of strain sensors are interconnected by embedded internal electrical connections formed of a matrix of fused conductive particles interlocked with a matrix of fused thermoplastic polymer particles.

16. The 3-dimensional printed load cell part of claim 1, wherein the thermoplastic polymer particles fused to form the part body and the thermoplastic polymer particles fused in the plurality of strain sensors have the same composition and average particle size.

17. The 3-dimensional printed load cell part of claim 16, wherein the average particle size of the thermoplastic polymer particles is from 20 microns to 100 microns.

18. The 3-dimensional printed load cell part of claim 16, wherein the thermoplastic polymer particles are selected from the group consisting of nylon 6 powder, nylon 9 powder, nylon 11 powder, nylon 12 powder, nylon 66 powder, nylon 612 powder, polyethylene powder, thermoplastic polyurethane powder, polypropylene powder, polyester powder, polycarbonate powder, polyether ketone powder, polyacrylate powder, polystyrene powder, and mixtures thereof.

19. The 3-dimensional printed load cell part of claim 18, wherein the thermoplastic polymer particles are nylon 12 powder having a melting point from about 175° C. to about 200° C.

20. The load cell of claim 13, wherein the thermoplastic polymer particles fused to form the part body and the thermoplastic polymer particles fused in the first set of strain sensors and the second set of strain sensors have the same composition and average particle size.

* * * * *